(12) United States Patent
Sasa et al.

(10) Patent No.: US 9,562,282 B2
(45) Date of Patent: Feb. 7, 2017

(54) TRANSPARENT CONDUCTIVE FILM AND PRODUCTION METHOD THEREFOR

(71) Applicant: NITTO DENKO CORPORATION, Ibaraki-shi, Osaka (JP)

(72) Inventors: Kazuaki Sasa, Ibaraki (JP); Yusuke Yamamoto, Ibaraki (JP); Hironobu Machinaga, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/761,195

(22) PCT Filed: Jan. 14, 2014

(86) PCT No.: PCT/JP2014/050464
§ 371 (c)(1),
(2) Date: Jul. 15, 2015

(87) PCT Pub. No.: WO2014/112481
PCT Pub. Date: Jul. 24, 2014

(65) Prior Publication Data
US 2016/0024640 A1    Jan. 28, 2016

(30) Foreign Application Priority Data

Jan. 16, 2013  (JP) ................. 2013-005499

(51) Int. Cl.
*B32B 15/08* (2006.01)
*C23C 14/08* (2006.01)
(Continued)

(52) U.S. Cl.
CPC ............. *C23C 14/086* (2013.01); *C23C 14/35* (2013.01); *C23C 14/5806* (2013.01); *H01L 31/1884* (2013.01); *Y02E 10/50* (2013.01)

(58) Field of Classification Search
USPC ................ 428/688, 689, 697, 699, 701, 702
See application file for complete search history.

(56) References Cited

U.S. PATENT DOCUMENTS 5,116,479 A    5/1992   Nakamura et al.
5,180,476 A    1/1993   Ishibashi et al.
(Continued)

FOREIGN PATENT DOCUMENTS

CN    1417809 A    5/2003
CN    1455826 A    11/2003
(Continued)

OTHER PUBLICATIONS

Notification of Transmittal of Translation of the International Preliminary Report on Patentability (Form PCT/IB/338) of International Application No. PCT/JP2014/050464 mailed Jul. 30, 2015 with Forms PCT/IB/373 and PCT/ISA/237 (5 pages).

(Continued)

*Primary Examiner* — Lauren R Colgan
(74) *Attorney, Agent, or Firm* — Westerman, Hattori, Daniels & Adrian, LLP

(57) ABSTRACT

A transparent conductive film includes a transparent conductive coating provided on at least one surface of an organic polymer film substrate, wherein the transparent conductive coating is a crystalline coating of an indium-based complex oxide having a content of a tetravalent metal element oxide of 7 to 15% by weight calculated by the formula {(the amount of the tetravalent metal element oxide)/(the amount of the tetravalent metal element oxide+ the amount of indium oxide)}=100(%), has a thickness in the range of more than 40 to 200 nm, a specific resistance of $1.2 \times 10^{-4}$ to $2.0 \times 10^{-4}$ Ω·cm, main X-ray diffraction peaks corresponding to (222) and (440) planes and has a ratio ($I_{440}/I_{222}$) of (440) peak intensity ($I_{440}$) to (222) peak intensity ($I_{222}$) of less than 0.3, and has an internal stress of (Continued)

700 MPa or less as determined by an X-ray stress measurement method.

13 Claims, 5 Drawing Sheets

(51) Int. Cl.
C23C 14/58 (2006.01)
C23C 14/35 (2006.01)
H01L 31/18 (2006.01)

(56) References Cited

U.S. PATENT DOCUMENTS

| | | |
|---|---|---|
| 6,617,056 B1 | 9/2003 | Hara et al. |
| 2003/0104232 A1 | 6/2003 | Kihara et al. |
| 2003/0159925 A1 | 8/2003 | Sako |
| 2003/0170449 A1 | 9/2003 | Kloppel et al. |
| 2003/0194551 A1 | 10/2003 | Sasa et al. |
| 2005/0287724 A1 | 12/2005 | Wakairo et al. |
| 2006/0068227 A1 | 3/2006 | Ukishima et al. |
| 2007/0117237 A1 | 5/2007 | Inoue |
| 2007/0154629 A1 | 7/2007 | Fujita |
| 2007/0169807 A1 | 7/2007 | Nakashima et al. |
| 2007/0224368 A1 | 9/2007 | Hara et al. |
| 2007/0224412 A1 | 9/2007 | Hara et al. |
| 2009/0315849 A1 | 12/2009 | Ito |
| 2010/0151178 A1 | 6/2010 | Sakaue et al. |
| 2010/0260986 A1 | 10/2010 | Ito |
| 2010/0311103 A1 | 12/2010 | Boukherroub et al. |
| 2011/0315214 A1 | 12/2011 | Yamanobe et al. |
| 2012/0111718 A1 | 5/2012 | Haishi et al. |
| 2012/0114923 A1 | 5/2012 | Haishi et al. |
| 2012/0315439 A1 | 12/2012 | Nakayama |
| 2012/0325310 A1 | 12/2012 | Chichibu et al. |
| 2015/0340644 A1 | 11/2015 | Lee et al. |

FOREIGN PATENT DOCUMENTS

| | | |
|---|---|---|
| CN | 1818136 A | 8/2006 |
| CN | 1968807 A | 5/2007 |
| CN | 101005101 A | 7/2007 |
| CN | 101044579 A | 9/2007 |
| CN | 101223591 A | 7/2008 |
| CN | 101868837 A | 10/2010 |
| CN | 102543301 A | 7/2012 |
| CN | 102792387 A | 11/2012 |
| CN | 104769739 A | 7/2015 |
| JP | 2-232358 A | 9/1990 |
| JP | 3-249171 A | 11/1991 |
| JP | 7-178863 A | 7/1995 |
| JP | 7335046 A | 12/1995 |
| JP | 2000-144379 A | 5/2000 |
| JP | 2003-532997 A | 11/2003 |
| JP | 2004-169138 A | 6/2004 |
| JP | 2004-214184 A | 7/2004 |
| JP | 2004-349112 A | 12/2004 |
| JP | 2005-259628 A | 9/2005 |
| JP | 2005-268113 A | 9/2005 |
| JP | 2006-117967 A | 5/2006 |
| JP | 2007-141755 A | 6/2007 |
| JP | 2009/238416 A | 10/2009 |
| JP | 2010-177161 A | 8/2010 |
| JP | 2011-018623 A | 1/2011 |
| WO | 00/51139 A1 | 8/2000 |
| WO | 2004/105054 A1 | 12/2004 |
| WO | 2005/021436 A1 | 3/2005 |
| WO | 2011/108552 A1 | 9/2011 |

OTHER PUBLICATIONS

International Search Report dated Apr. 22, 2014, issued in counterpart application No. PCT/JP2014/050464 (2 pages).
Office Action dated Mar. 2, 2016, issued in counterpart Chinese Patent Application No. 201480005113.9, with English translation. (17 pages).
Office Action dated Mar. 31, 2016, issued in counterpart Chinese Patent Application No. 201480005116.2, with English translation. (20 pages).
Office Action dated Apr. 1, 2016, issued in counterpart Chinese Patent Application No. 20148005117.7, with English translation. (14 pages).
Office Action dated Mar. 28, 2016, issued in counterpart Chinese Patent Application No. 201480005118.1, with English translation. (17 pages).
Office Action dated May 23, 2016, issued in U.S. Appl. No. 14/761,208 (18 pages).
Office Action dated Apri 5, 2016, issued in U.S. Appl. No. 14/761,211. (17 pages).
International Search Report dated Apr. 22, 2014, issued in counterpart application No. PCT/JP2014/050599 (2 pages).
International Search Report dated Apr. 22, 2014, issued in counterpart application No. PCT/JP2014/050597 (2 pages).
Office Action dated May 31, 2016, issued in U.S. Appl. No. 14/761,193 (24 pages).
International Search Report dated Apr. 22, 2014, issued in counterpart application No. PCT/JP2014/050600 (2 pages).
Notification of Transmittal of Translation of the International Preliminary Report on Patentability (Form PCT/IB/338) of International Application No. PCT/JP2014/050597 mailed Jul. 30, 2015 with Forms PCT/IB/373 and PCT/ISA/237 (5 pages).
Notification of Transmittal of Translation of the International Preliminary Report on Patentability (Form PCT/IB/338) of International Application No. PCT/JP2014/050599 mailed Jul. 30, 2015 with Forms PCT/IB/373 and PCT/ISA/237 (5 pages).
Notification of Transmittal of Translation of the International Preliminary Report on Patentability (Form PCT/IB/338) of International Application No. PCT/JP2014/050600 mailed Jul. 30, 2015 with Forms PCT/IB/373 and PCT/ISA/237 (5 pages).
Office Action dated Aug. 19, 2016, issued in Chinese Patent Application No. 201480005113.9 which corresponds to U.S. Appl. No. 14/761,195, with English translation. (11 pages).
Office Action dated Aug. 23, 2016, issued in Korean Patent Application No. 10-2015-7020652 which corresponds to U.S. Appl. No. 14/761,208, with English translation. (13 pages).
Final Office Action dated Sep. 6, 2016. issued in U.S. Appl. No. 14/761,211 (14 pages).
Final Office Action dated Oct. 6, 2016, issued in U.S. Appl. No. 14/761,208 (22 pages).
Notice of Allowance dated Sep. 13, 2016, issued in U.S. Appl. No. 14/761,211 (16 pages).
Office Action dated Sep. 26, 2016, issued in Chinese Application No. 20140005118.1, which corresponds to U.S. Appl. No. 14/761,193, with English translation. (17 pages).
Office Action dated Oct. 27, 2016, issued in counterpart Korean Application No. 10-2015-7020649, with English translation (corresponds to U.S. Appl. No. 14/761,195). (9 pages).
Office Action dated Nov. 15, 2016, issued in Chinese patent application No. 2014800051162 (counterpart to U.S. Appl. Nos. 14/761,193; 14/761,211 and 14/761,208), with English translation. (20 pages).
Notification of Reason of Refusal dated Nov. 16, 2016, issued in Korean patent application No. 10-2015-7020650 (counterpart to U.S. Appl. Nos. 14/761,193; 14/761,211 and 14/761,208). (9 pages).
Notification of Reason of Refusal, dated Nov. 16, 2016, issued in Korean patent application No. 10-2015-7020653 (counterpart to U.S. Appl. Nos. 14/761,193; 14/761,211 and 14/761,208). (11 pages).
Notice of Allowance dated Nov. 25, 2016, issued in U.S. Appl. No. 14/761,193 (26 pages).
Office Action dated Nov. 28, 2016, issued in Chinese Application No. 201480005117.7 (counterpart to U.S. Appl. Nos. 14/761,193; 14/761,211 and 14/761,208), with English translation. (11 pages).

X-ray diffraction chart of Example 1

TEM photograph of Example 9 (crystalline)

TRANSPARENT CONDUCTIVE FILM AND PRODUCTION METHOD THEREFOR

TECHNICAL FIELD

The invention relates to a transparent conductive film having high transparency in the visible light region and including an organic polymer film substrate and a transparent conductive coating provided thereon. The invention also relates to a method for producing the transparent conductive film. The transparent conductive film of the invention has a transparent conductive thin coating with a low level of specific resistance and surface resistance.

The transparent conductive film of the invention is useful for electrode applications requiring low surface resistance, such as transparent electrodes for displays such as film liquid crystal displays and film OLED displays, transparent electrodes for capacitive touch panels, and electrodes for film OLED lighting. The transparent conductive film of the invention is also suitable for use as a film solar cell electrode and for use in the prevention of static charge of transparent products, the shielding of electromagnetic waves from transparent products, and other applications.

BACKGROUND ART

A conventionally well-known transparent conductive film is what is called a conductive glass, which includes a glass substrate and an ITO coating (indium-tin complex oxide coating) formed thereon. When an ITO coating is formed on a glass substrate, the coating can be deposited while the glass substrate is heated at 200° C. or higher, generally, 300° C. or higher. In this case, therefore, an ITO coating with a thickness of 130 nm and a low surface resistance of 10 Ω/square or less (a specific resistance of $1.3 \times 10^{-4}$ Ω·cm) can be easily obtained.

However, the glass substrate, which has low flexibility and workability, cannot be used in some cases. In recent years, therefore, transparent conductive films having an ITO coating formed on various organic polymer film substrates such as polyethylene terephthalate films are used because of their advantages such as a high level of flexibility, workability, and impact resistance, and light weight.

The preferred level of specific resistance and surface resistance, required of the ITO coating-bearing transparent conductive film, varies with the use of the transparent conductive film. However, the ITO coating formed on the organic polymer film substrate has become required to have the same level of specific resistance and surface resistance as that of the ITO coating formed on the glass substrate. For example, film displays have been studied recently. For such display applications, the ITO coating formed on the organic polymer film substrate has been required to have a low resistance of 10 Ω/square or less per 130 nm thickness, which is the same level as that of the ITO coating formed on the glass substrate. Transparent electrode applications for introduction of light into solar cells, particularly, transparent electrode applications for thin film solar cells require a resistance of 10 Ω/square or less, a high transmittance in the near-infrared region, and high reliability under a high-temperature, high-humidity atmosphere.

A variety of processes are proposed for the ITO coating-bearing transparent conductive film (Patent Documents 1 to 5).

PRIOR ART DOCUMENTS

Patent Documents

Patent Document 1: JP-A-2010-177161
Patent Document 2: JP-A-2000-144379
Patent Document 3: JP-A-02-232358
Patent Document 4: JP-A-03-249171
Patent Document 5: JP-A-2011-018623

SUMMARY OF THE INVENTION

Problems to be Solved by the Invention

Unfortunately, an ITO coating deposited on an organic polymer film substrate generally has a specific resistance higher than that of an ITO coating deposited on a glass substrate. There may be two reasons for this. A first reason is that most organic polymer film substrates cannot be heated at high temperatures because their glass transition temperature or heat-resistant temperature is lower than 200° C., and, therefore, the amount of tin atoms substituting for indium sites is limited so that the resulting ITO coating has an electron carrier density n lower by one order of magnitude. A second reason is that water adsorbed on an organic polymer film substrate and gases generated when the substrate is brought into contact with plasma, as well as excess tin atoms contained in a target, can act as impurities to inhibit crystal growth. Thermal deformation and low smoothness of a film substrate may also have an adverse effect on crystal growth. Excess tin atoms are more likely to be locally converted to tin oxide ($SnO_2$). This, in Patent Document 1 and 2, can not only inhibit crystal growth but also form defects capable of scattering electrons also into crystals by an internal stress. Both causes are considered to work together to reduce electron mobility μ. For these reasons, it has been difficult to form an ITO coating with a thickness of 130 nm, a surface resistance of about 30 Ω/square, and a specific resistance of $4 \times 10^{-4}$ Ω·cm or less on an organic polymer film substrate.

Patent Document 1 proposes that an ITO coating having a strongest X-ray diffraction peak corresponding to the (400) plane and having a specific resistance (volume resistance) of $1 \times 10^{-4}$ to $6 \times 10^{-4}$ Ω·cm can be deposited by using plasma assisted sputtering in which plasma is generated at a middle position between a substrate and a target during the sputtering or by using ion beam assisted sputtering in which sputtering is performed with ion beam assistance. However, this method has a problem with uniformity or stability in a roll-to-roll (R-to-R) system although the ion beam or additional RF plasma can be used between a target (T) and a substrate (S) when a batch deposition system with a narrow T-S distance is used for sputtering deposition. Patent Document 1 shows that the resulting ITO coating has a carrier concentration of $5 \times 10^{20}$ to $2 \times 10^{21}$ cm$^{-3}$ and a carrier mobility of 15 to 25 cm$^2$/V/s and that the ITO coating in the examples has a volume resistance of about $5 \times 10^{-4}$ Ω·cm. The disclosure in Patent Document 1 does not make it possible to obtain an ITO coating with a substantially low specific resistance of $1 \times 10^{-4}$ Ω·cm.

Patent Document 2 proposes that an ITO coating with a specific resistance of $1 \times 10^{-4}$ to $4.1 \times 10^{-4}$ Ω·cm can be formed by a common magnetron sputtering process if the process includes reducing the partial pressure of water in a chamber at a substrate temperature of less than 80° C., temporarily depositing a coating with a specific resistance of $4 \times 10^{-4}$ to $6 \times 10^{-4}$ Ω·cm while controlling the partial pressures of oxygen and inert gas, and then heat-treating the coating under an oxygen atmosphere at a temperature not higher than the glass transition temperature. In the technique of Patent Document 2, however, the use of common magnetron sputtering deposition can cause recoiling argon or oxygen negative ions to damage the coating so that defects and impurities can be introduced into the ITO coating. Therefore, Patent Document 2 shows that the ITO coating obtained in the examples, with a thickness of 130 nm, has a specific resistance of at least about $1.8 \times 10^{-4}$ Ω·cm. The disclosure in Patent Document 2 does not make it possible to obtain an ITO coating with a low specific resistance of $1.5 \times 10^{-4}$ Ω·cm or less, particularly, $1.0 \times 10^{-4}$ Ω·cm.

Patent Documents 3 and 4 propose that in magnetron sputtering deposition, recoiling argon- or oxygen negative ions-induced damage to the deposited coating can be reduced by increasing the magnetic field intensity or by superimposing RF power to reduce the discharge voltage, so that an ITO coating with a low specific resistance can be deposited. Patent Documents 3 and 4 disclose the use of a glass substrate, which can be heated at high temperatures. However, when an organic polymer film substrate is used in the method described in Patent Documents 3 and 4, the substrate can be heated only to the glass transition temperature or lower. Therefore, if an organic polymer substrate film is used in the method described in Patent Documents 3 and 4, the resulting ITO coating is an amorphous coating. Even if the technique described in Patent Documents 3 and 4 is used, it is not possible to form, on an organic polymer film substrate, a completely crystallized ITO coating with a specific resistance as low as that of an ITO coating formed on a glass substrate.

Patent Document 5 proposes an ITO coating deposition method in which an RF power of 0.5 to 2.0 times DC power is superimposed in a target surface magnetic field of 60 to 80 mT. The document discloses that the ITO coating obtained by the deposition method can have a low resistivity (specific resistance) of $1.5 \times 10^{-4}$ Ω·cm or less when the coating forms a specific crystalline state in which the (400) plane peak is greater than the (222) plane peak, as measured by X-ray diffraction method. However, Patent Document 5 shows the use of a glass substrate, which can be set in the temperature range of 230 to 250° C. If an organic polymer film substrate is used in the method described in Patent Document 5, it is difficult to obtain the (400) plane peak as a main peak, which means that in that case, it is not possible to deposit an ITO coating with a specific resistance as low as that shown in Patent Document 5.

It is an object of the invention to provide a transparent conductive film including an organic polymer film substrate and a transparent conductive coating that is provided on the substrate and made of a crystalline coating and has low internal stress and a low level of specific resistance and surface resistance, and to provide a method for producing such a transparent conductive film.

Means for Solving the Problems

As a result of earnest study to achieve the object, the inventors have accomplished the invention based on findings that the object can be achieved by the transparent conductive film and the method for production thereof described below.

Specifically, the invention is directed to a transparent conductive film, comprising: an organic polymer film substrate; and a transparent conductive coating provided on at least one surface of the organic polymer film substrate, wherein the transparent conductive coating is a crystalline coating of an indium-based complex oxide having a content of a tetravalent metal element oxide of 7 to 15% by weight as calculated by the formula {(the amount of the tetravalent metal element oxide)/(the amount of the tetravalent metal element oxide+the amount of indium oxide)}×100(%), the transparent conductive coating has a thickness in the range of more than 40 to 200 nm, the transparent conductive coating has a specific resistance of $1.2 \times 10^{-4}$ to $2.0 \times 10^{-4}$ Ω·cm, the transparent conductive coating has main X-ray diffraction peaks corresponding to (222) and (440) planes and also has a ratio ($I_{440}/I_{222}$) of (440) peak intensity ($I_{440}$) to (222) peak intensity ($I_{222}$) of less than 0.3, and the transparent conductive coating has an internal stress of 700 MPa or less as determined by an X-ray stress measurement method.

The transparent conductive film may further include an undercoat layer provided on the film substrate, wherein the transparent conductive coating may be provided on the film substrate with the undercoat layer interposed therebetween.

In the transparent conductive film, the indium-based complex oxide may be an indium-tin complex oxide, and the tetravalent metal element oxide may be tin oxide.

The invention is also directed to a method for producing the transparent conductive film, the method including:

the step (A) of forming a transparent conductive coating on at least one surface of an organic polymer film substrate in the presence of inert gas by RF superimposed DC sputtering deposition using an indium-based complex oxide target with a high horizontal magnetic field of 85 to 200 mT at the surface of the target, wherein the indium-based complex oxide target has a content of a tetravalent metal element oxide of 7 to 15% by weight as calculated by the formula {(the amount of the tetravalent metal element oxide)/(the amount of the tetravalent metal element oxide+ the amount of indium oxide)}×100(%).

In the transparent conductive film-producing method, the high magnetic field RF superimposed DC sputtering deposition in the forming step (A) is preferably performed with a ratio of RF power to DC power of 0.4 to 1.2 when the RF power source has a frequency of 10 to 20 MHz.

In the transparent conductive film-producing method, the high magnetic field RF superimposed DC sputtering deposition in the forming step (A) is preferably performed with a ratio of RF power to DC power of 0.2 to 0.6 when the RF power source has a frequency of more than 20 MHz to 60 MHz.

In the transparent conductive film-producing method, the organic polymer film substrate preferably has a temperature of 80 to 180° C. in the high magnetic field RF superimposed DC sputtering deposition in the forming step (A).

In the transparent conductive film-producing method, the high magnetic field RF superimposed DC sputtering deposition in the forming step (A) may be performed without introducing oxygen.

In the transparent conductive film-producing method, the high magnetic field RF superimposed DC sputtering deposition in the forming step (A) may be performed while oxygen is introduced in such a way that the amount of oxygen is 0.5% or less relative to the amount of the inert gas.

The transparent conductive film-producing method may further include a pre-sputtering step (a) that is performed before the high magnetic field RF superimposed DC sputtering deposition and includes forming a coating in the presence of inert gas without introduction of oxygen by RF superimposed DC sputtering deposition with a ratio of RF power to DC power of 0.4 to 1.2 at an RF power source frequency of 10 to 20 MHz until the resulting resistance reaches a stable level.

The transparent conductive film-producing method may further include a pre-sputtering step (a) that is performed before the high magnetic field RF superimposed DC sputtering deposition and includes forming a coating in the presence of inert gas without introduction of oxygen by RF superimposed DC sputtering deposition with a ratio of RF power to DC power of 0.2 to 0.6 at an RF power source frequency of more than 20 MHz to 60 MHz until the resulting resistance reaches a stable level.

The transparent conductive film-producing method may further include an annealing step (B) that is performed after the forming step (A). The annealing step (B) is preferably performed at a temperature of 120 to 180° C. for 5 minutes to 5 hours in the air.

Effect of the Invention

The invention makes it possible to provide a transparent conductive film including an organic polymer film substrate and a crystalline transparent conductive coating that is provided on the substrate and made of an indium-based complex oxide (such as an indium-tin complex oxide (ITO)) with a thickness of more than 40 to 200 nm and has low internal stress and the same low level of specific resistance and surface resistance as a transparent conductive coating formed on a glass substrate. In the transparent conductive film of the invention, the crystalline coating has low internal stress and therefore is less likely to contain defects or impurities.

According to the transparent conductive film-producing method of the invention, a crystalline transparent conductive coating having the same low level of specific resistance and surface resistance as a transparent conductive coating formed on a glass substrate can be deposited on an organic polymer film substrate using a roll-to-roll (R-to-R) system under temperature conditions lower than those for forming a transparent conductive coating on a glass substrate. In the production method of the invention with these features, the high magnetic field RF superimposed DC sputtering deposition is a low-damage deposition technique that is less likely to introduce defects or impurities into the coating and can reduce internal stress.

According to the production method of the invention, the high magnetic field RF superimposed DC sputtering deposition can be adapted to manufacturing facility, in which the RF power can be set smaller than the DC power, and the RF power-introducing process and radio wave shielding can be easily performed in the high magnetic field RF superimposed DC sputtering deposition. In addition, even when a transparent conductive coating is formed by the high magnetic field RF superimposed DC sputtering deposition in the forming step (A), the transparent conductive coating can be crystallized by a heat treatment at a low temperature for a short time in the annealing step (B), so that the resulting transparent conductive coating has a high transmittance and high reliability.

In the production method of the invention, the pre-sputtering step (a), which has been previously unknown, may be performed before the high magnetic field RF superimposed DC sputtering deposition for the forming step (A). In this case, not only water can be removed from the surface of the indium-based complex oxide target, but also modification can be performed so that oxygen in the target itself can be ready to be efficiently incorporated into the ITO crystal coating, which makes it possible to efficiently obtain a transparent conductive coating with a low content of defects and impurities and a low level of specific resistance and surface resistance under temperature conditions lower than those for forming a transparent conductive coating on a glass substrate.

MODE FOR CARRYING OUT THE INVENTION

Figure 1:
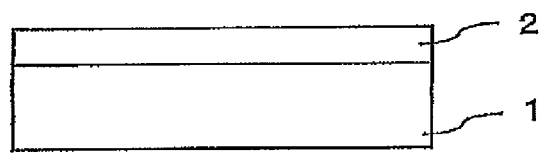
FIG. 1 is a schematic cross-sectional view showing an example of the transparent conductive film of the invention.

Hereinafter, the transparent conductive film of the invention and the method for the production thereof will be described with reference to the drawings. FIG. 1 is a schematic cross-sectional view showing an example of the transparent conductive film of the invention, which includes an organic polymer film substrate (1) and a transparent conductive coating (2) provided on one surface of the substrate (1). The transparent conductive coating (2) is made of an indium-based complex oxide containing an oxide of a tetravalent metal element. Although FIG. 1 shows that the transparent conductive coating (2) is provided on only one surface of the organic polymer film substrate (1), the transparent conductive coating (2) may also be provided on the other surface of the film substrate (1).

Although not shown in FIG. 1, an undercoat layer for anti-reflection or other purposes may be provided on the film substrate (1), and the transparent conductive coating (2) may be provided on the film substrate (1) with the undercoat layer interposed therebetween. When a transparent conductive thin coating (2) is formed by high magnetic field RF superimposed DC sputtering deposition as in the production method of the invention, elements such as C and H can be incorporated from the organic polymer film substrate (1) into an ITO coating to make the crystallization of the coating difficult. In this case, therefore, it is preferable to form the undercoat layer.

A film with a high level of transparency, heat resistance, and surface smoothness is preferably used as the organic polymer film substrate (1). Examples of the material for such a film include polyester such as polyethylene terephthalate or polyethylene naphthalate, polyolefin, polycarbonate, polyether sulfone, polyarylate, polyimide, polyamide, polystyrene, and homopolymers or copolymers of norbornene or the like. The organic polymer film substrate (1) may also be an epoxy resin film or the like.

In general, the thickness of the film substrate (1) is preferably in the range of 16 to 400 μm, more preferably in the range of 20 to 185 μm, although it depends on the deposition conditions or intended use. The coating may be formed on the film being taken up in a roll-to-roll (R-to-R) system. In this case, if the film is too thin, heat-induced wrinkles or static electricity can occur to make the take-up process difficult, and if the film is too thick, the film can behave like a solid plate and be impossible to take up.

The film substrate (1) may be subjected to a surface modification step (pretreatment) depending on the type of the film substrate (1). The surface modification treatment may be a plasma treatment under an inert gas atmosphere such as an argon or nitrogen gas atmosphere. Alternatively, the film substrate (1) may be previously subjected to sputtering, corona discharge, flame treatment, ultraviolet irradiation, electron beam irradiation, chemical treatment, oxidation, or other etching or undercoating treatment so that it can have improved tackiness to the transparent conductive coating (2) or the undercoat layer formed thereon. If necessary, dust removing or cleaning may also be performed on the film substrate (1) by solvent or ultrasonic cleaning before the transparent conductive coating (2) or the undercoat layer is formed.

The undercoat layer may be made of an inorganic material, an organic material, or a mixture of inorganic and organic materials. The inorganic material is preferably, for example, $SiO_x$ (x=1 to 2), $MgF_2$, $Al_2O_3$, $TiO_2$, $Nb_2O_5$, or the like. The organic material may be an acrylic resin, a urethane resin, a melamine resin, an alkyd resin, a siloxane polymer, or the like. The organic material is preferably a thermosetting resin including a blend of a melamine resin, an alkyd resin, and an organosilane condensate.

Using any of the above materials, the undercoat layer can be formed by a dry process such as vacuum deposition, sputtering, or ion plating or a wet process (coating process) or the like. A single undercoat layer may be provided, or two or more undercoat layers may be provided. In general, the thickness of the undercoat layer (or the thickness of each of two or more undercoat layers) may be from about 1 to about 300 nm.

The material used to form the transparent conductive coating (2) may be appropriately selected depending on the method for forming the thin coating. In general, a sintered material composed of indium oxide and an oxide of a tetravalent metal element is preferably used to form the transparent conductive coating (2).

Examples of the tetravalent metal element include tin, cerium, hafnium, zirconium, titanium, and the like. Oxides of these tetravalent metal elements include tin oxide, cerium oxide, hafnium oxide, zirconium oxide, titanium oxide, and the like. Tin is preferably used as the tetravalent metal element. The oxide of the tetravalent metal element is preferably an oxide of tin, and the indium-based complex oxide is preferably an indium-tin complex oxide.

The transparent conductive coating (2) is formed using an indium-based complex oxide including indium oxide and a tetravalent metal element oxide, in which the content of the tetravalent metal element oxide calculated by the formula {(the amount of the tetravalent metal element oxide)/(the amount of the tetravalent metal element oxide+the amount of indium oxide)}×100(%) is from 7 to 15% by weight. The content of the tetravalent metal element oxide in the indium-based complex oxide is preferably from 8 to 13% by weight.

If the content of the tetravalent metal element oxide in the indium-based complex oxide is low, the amount of the tetravalent metal atoms capable of replacing the indium atoms will be relatively small, which can make it difficult to ensure a sufficient electron density and to obtain a transparent conductive coating with a low resistance. On the other hand, if the content is high, not only it will be difficult to crystallize the resulting transparent conductive coating (amorphous coating), but also a surplus amount of the tetravalent metal element or the oxide may remain to form an impurity region, so that the resulting transparent conductive coating may have degraded properties, because the temperature which the polymer film substrate (1) can withstand is generally around 180° C. or less and therefore the substitution of the indium lattice with the tetravalent metal atoms is limited.

The thickness of the transparent conductive coating (2), which influences the increase of application size or the improvement of conduction efficiency, is from more than 40 to 200 nm, preferably from 80 to 200 nm, more preferably from 100 to 150 nm, in view of optical properties, resistance, or the like. The transparent conductive coating (2) with a thickness of more than 40 to 200 nm is suitable for electrode applications for LCDs, solar cells, and the like.

The transparent conductive coating (2) is a crystalline coating. Preferably, the crystalline coating is completely crystallized. Whether it is a crystalline coating can be determined by transmission electron microscope (TEM) observation. As used herein, the term "completely crystallized" refers to the state in which crystallized grains are present over the entire surface observed with a transmission electron microscope (TEM). On the other hand, the transparent conductive coating decreases in surface resistance as crystallization proceeds, and its surface resistance becomes constant when crystallization is completed. The coating with a thickness of 130 nm preferably has a surface resistance of 15 Ω/square or less, more preferably 12 Ω/square or less.

The transparent conductive coating (2) has a low specific resistance of $1.2 \times 10^{-4}$ to $2.0 \times 10^{-4}$ Ω·cm. The specific resistance is preferably from $1.2 \times 10^{-4}$ to $1.6 \times 10^{-4}$ Ω·cm, more preferably from $1.2 \times 10^{-4}$ to $1.3 \times 10^{-4}$ Ω·cm.

The transparent conductive coating (2) has main X-ray diffraction peaks corresponding to (222) and (440) planes and also has a ratio ($I_{440}/I_{222}$) of the (440) peak intensity ($I_{440}$) to the (222) peak intensity ($I_{222}$) of less than 0.3. When the peak intensity ratio ($I_{440}/I_{222}$) is less than 0.3, the coating is not polycrystalline and thus has high mobility, which is advantageous in that a high near-infrared transmittance can be provided when the coating is used in solar cell applications. The peak intensity ratio ($I_{440}/I_{222}$) is preferably 0.29 or less, more preferably 0.25 or less.

The transparent conductive coating (2) has an internal stress of 700 MPa or less as determined by an X-ray stress measurement method. The internal stress is preferably 700 MPa or less, more preferably 600 MPa or less, in view of the reliability of mobility against heat and moisture.

Next, the method of the invention for producing the transparent conductive film will be described. The method of the invention for producing the transparent conductive film includes the step (A) of forming a transparent conductive coating in the presence of inert gas by RF superimposed DC sputtering deposition using an indium-based complex oxide target with a high horizontal magnetic field of 85 to 200 mT at the surface of the target.

Figure 2:
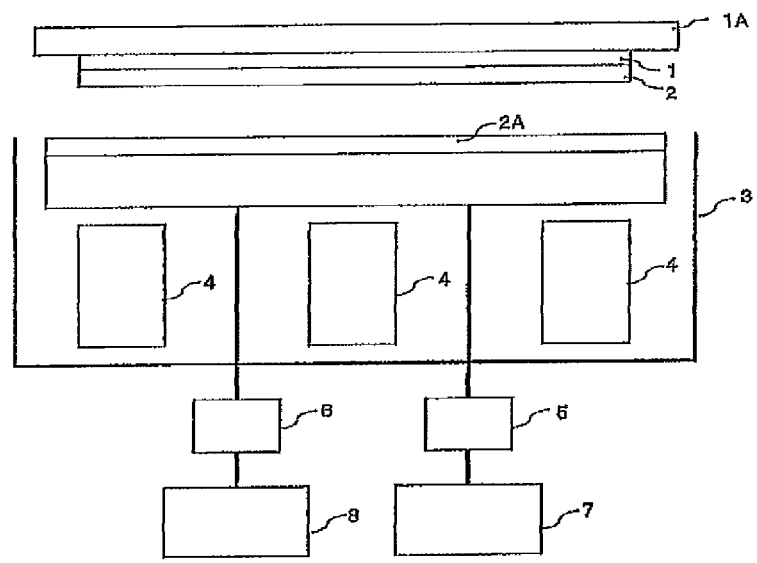
FIG. 2 is a schematic diagram showing an example of a system for use in high magnetic field RF superimposed DC sputtering deposition for the transparent conductive film-producing method of the invention.

FIG. 2 is a schematic diagram showing an example of a deposition system for use in high magnetic field RF superimposed DC sputtering deposition for the forming step (1). FIG. 2 shows a sputtering system in which an indium-based complex oxide target (2A) is attached to a sputtering electrode (3) and used to form an indium-based complex oxide thin coating (2) on a film substrate (1) facing the target (2A). The film substrate (1) is held on a substrate holder or can roll (1A). The horizontal magnetic field on the target (2A) is set at 85 to 200 mT, which is higher than a normal magnetic field (30 mT). Such a high magnetic field can be adjusted by providing high-field magnets (4). Setting the magnetic field high makes it possible to obtain a transparent conductive coating having a low level of specific resistance and surface resistance. The high magnetic field is preferably from 100 to 160 mT.

In general sputtering deposition, a DC power source (direct current source) (8) is used to apply DC power or pulsed power to a target when sputtering is performed. As shown in the system of FIG. 2, however, the high magnetic field RF superimposed DC sputtering deposition according to the invention is performed using a DC power source (8) and an RF power source (7) (a variable frequency, high-frequency power source). The RF power source (7) and the DC power source (8) are so arranged and connected to the sputtering electrode (3) as to apply RF power and DC power at the same time. As shown in FIG. 2, a matching box (5) may be provided between the RF power source (7) and the sputtering electrode (3) to efficiently transmit RF power from the RF power source (7) to the target (2A). As shown in FIG. 2, a water cooled low-pass filter (6) may also be placed between the DC power source (8) and the sputtering electrode (3) so that the RF power from the RF power source (7) will not have any effect on the DC power source (8).

In the high magnetic field RF superimposed DC sputtering deposition for the forming step (A), when the frequency of the RF power source is from 10 to 20 MHz, the ratio of the RF power to the DC power is preferably set to 0.4 to 1.2 in view of low-damage deposition and the degree of oxidation of the coating. The power ratio is preferably from 0.5 to 1.0, more preferably from 0.6 to 1.0. The RF power source frequency (10 to 20 MHz) is preferably 13.56 MHz. On the other hand, when the frequency of the RF power source is higher than 20 MHz and not higher than 60 MHz, the ratio of the RF power to the DC power is preferably set to 0.2 to 0.6 in view of low-damage deposition and the degree of oxidation of the coating. In this case, the power ratio is preferably from 0.3 to 0.5. The RF power source frequency (higher than 20 MHz and not higher than 60 MHz) is preferably 27.12 MHz, 40.68 MHz, or 54.24 MHz.

In the high magnetic field RF superimposed DC sputtering deposition for the forming step (A), the temperature of the organic polymer film substrate (1) is preferably from 80 to 180° C. When the temperature of the film substrate (1) is 80° C. or higher during the sputtering deposition, a seed for crystallization can be formed even in an indium-based complex oxide coating with a high tetravalent metal atom content. When the transparent conductive coating formed in the step (A) is amorphous, the annealing step (B) described below can easily facilitate the crystallization of the indium-based complex oxide coating, so that a crystalline transparent conductive coating (2) with a lower surface resistance can be obtained. Therefore, the temperature of the film substrate (1) is preferably 100° C. or higher, more preferably 120° C. or higher, even more preferably 130° C. or higher, further more preferably 140° C. or higher, so that the amorphous transparent conductive coating can be crystallized by heating to form a crystalline transparent conductive coating (2) with a low surface resistance. In order to suppress thermal damage to the film substrate (1), the temperature of the substrate is preferably 180° C. or lower, more preferably 170° C. or lower, even more preferably 160° C. or lower.

As used herein, the term "the temperature of the film substrate" refers to the set temperature of the support on which the film substrate is placed during the sputtering deposition. For example, when a roll sputtering system is used to perform continuous sputtering deposition, the temperature of the substrate corresponds to the temperature of the can roll on which sputtering deposition is performed. When sputtering deposition is performed piece by piece (batch mode), the temperature of the substrate corresponds to the temperature of the substrate holder adapted to hold the substrate.

The high magnetic field RF superimposed DC sputtering deposition for the forming step (A) may be performed as follows. The sputtering target is placed in the sputtering system, which is then evacuated to high vacuum. Inert gas such as argon gas is then introduced into the sputtering system. The deposition may be performed without introducing oxygen into the sputtering system containing inert gas such as argon gas. On the other hand, to improve the transmittance of the transparent conductive coating, oxygen gas or the like may be introduced in addition to the inert gas such as the argon gas, when the transparent conductive coating is desired as a crystalline coating immediately after the deposition in the forming step (A), when the deposition is performed using a ratio of the RF power to the DC power of 0.4 to 0.6 at an RF power source frequency of 10 to 20 MHz, or when the deposition is performed using a ratio of the RF power to the DC power of 0.2 to 0.3 at an RF power source frequency of more than 20 MHz to 60 MHz. Otherwise, an oxygen-deficient coating may be formed in these cases. The oxygen gas is preferably so introduced that the amount of oxygen is 0.5% or less, more preferably 0.3% or less, relative to the amount of the inert gas.

If water molecules are present in the deposition atmosphere, they can terminate dangling bonds, which occur during the deposition, and interfere with the growth of an indium-based complex oxide crystal. Therefore, the deposition atmosphere preferably has a lower water partial pressure. During the deposition, the partial pressure of water is preferably 0.1% or less, more preferably 0.07% or less of the partial pressure of the inert gas. During the deposition, the partial pressure of water is preferably $2\times10^{-4}$ Pa or less, more preferably $1.5\times10^{-4}$ Pa or less, even more preferably $1\times10^{-4}$ Pa or less. In order to set the partial pressure of water in the above range during the deposition, the sputtering system is preferably evacuated to $1.5\times10^{-4}$ Pa or less, more preferably $5\times10^{-5}$ Pa or less, before the start of the deposition so that water and impurities such as organic gases generated from the substrate are removed from the atmosphere in the system and the partial pressure of water falls within the above range.

Particularly, when an R-to-R system is used for continuous production, the generated gases are preferably removed while the substrate is fed without performing deposition. Otherwise crystallization can be difficult, particularly when a transparent conductive thin coating including an indium-based complex oxide with a high content of a tetravalent metal oxide (such as tin oxide) is obtained.

Before the high magnetic field RF superimposed DC sputtering deposition is performed for the forming step (A), a pre-sputtering step (a) may be performed. The pre-sputtering step (a) includes performing pre-sputtering deposition in the presence of inert gas without introduction of oxygen by RF superimposed DC sputtering deposition with a high horizontal magnetic field of 85 to 200 mT at the surface of the target with a ratio of RF power to DC power in the same range as one of the ranges for the main deposition step until the resulting resistance reaches a stable level.

Figure 6:
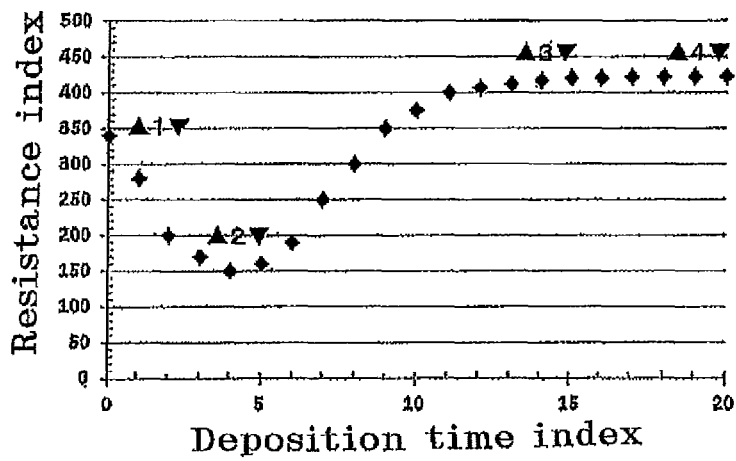
FIG. 6 is a graph showing an advantageous effect obtained when pre-sputtering is performed before the high magnetic field RF superimposed DC sputtering deposition in the production method of the invention.

The phrase "the resulting resistance reaches a stable level" indicates the phase ▲4▼ in FIG. 6, which means that phases in which water and gases generated on and from the target and the vacuum chamber wall are removed (phases ▲1▼ to ▲3▼) go by, so that fluctuations in the resistance fall within ±2% as a result of stable activation of the target surface with the high magnetic field and the RF and DC powers.

An annealing step (B) may be performed after the transparent conductive thin coating is formed by the high magnetic field RF superimposed DC sputtering deposition in the forming step (A). When an amorphous transparent conductive coating is formed in the step (A), the coating can be crystallized by the annealing step (B).

The annealing step (B) is preferably performed at a temperature of 120 to 180° C. for 5 minutes to 5 hours in the air. When the heating temperature and the heating time are appropriately selected, the coating can be converted to a completely crystallized form without degradation of productivity or quality. The annealing may be performed by a known method using a heating system such as an infrared heater or a hot air circulation oven.

A crystalline coating of an indium-based complex oxide may be obtained without the annealing step (B). In this case, the temperature of the organic polymer film substrate (1) is preferably set at 150° C. or higher in the above range in the high magnetic field RF superimposed DC sputtering deposition for the forming step (A). In this case, when the RF power source frequency is 10 to 20 MHz, the ratio of the RF power to the DC power is preferably set at less than 1.2 in the above range. The RF power source frequency (10 to 20 MHz) is preferably 13.56 MHz. When the RF power source frequency is higher than 20 MHz and not higher than 60 MHz, the ratio of the RF power to the DC power is preferably set at less than 0.6. The RF power source frequency (higher than 20 MHz and not higher than 60 MHz) is preferably 27.12 MHz, 40.68 MHz, or 54.24 MHz.

The transparent conductive film may be used to form a projective capacitive touch panel, a matrix resistive touch panel, or the like. In this case, the resulting transparent conductive coating (2) may be patterned into a predetermined shape (such as a strip shape). It should be noted that after crystallized by the annealing step (B), an indium-based complex oxide coating can resist acid etching, whereas before the annealing step (B), an amorphous indium-based complex oxide coating can be easily etched. Therefore, an amorphous transparent conductive coating (2) should be formed and then patterned by etching before the annealing step (B).

The production method of the invention makes it possible to obtain a crystalline transparent conductive coating of an indium-based complex oxide having a thickness of more than 40 nm to 200 nm, the low specific resistance mentioned above, a peak intensity ratio ($I_{440}/I_{222}$) of less than 0.3, and an internal stress of 700 MPa or less as determined by an X-ray stress measurement method. When the transparent conductive coating is formed by high magnetic field RF superimposed DC sputtering deposition on the film substrate being heated at a temperature of 80 to 180° C., the discharge voltage can be reduced to ½ to ⅕ of that in a normal magnetic field deposition process. In this case, therefore, the kinetic energy of atoms and molecules being deposited on the film substrate can be reduced correspondingly. In addition, negative ions such as electrons and recoiling inert gas having collided with the target are also less likely to reach the film substrate, so that the internal stress and the contamination of the coating with impurities can be reduced. In addition, the deposition at a film substrate temperature of 80 to 180° C. can form a coating capable of undergoing facilitated (222)-oriented crystal growth.

Hereinafter, conditions for the method of the invention for producing the transparent conductive film will be further described with reference to FIGS. 3 to 11.

Indium-based complex oxide targets (specifically, indium-tin complex oxide targets) available from Japanese manufacturers have remarkably improved quality. Every manufacturer has been able to provide the same level of product properties. All manufacturers' target products have a relative density of 98% or more and substantially the same degree of oxidation. When a chamber is sufficiently pre-evacuated to $1.5\times10^{-4}$ Pa or less for general magnetron sputtering deposition with such products, a transparent conductive coating with a minimum surface resistance can be obtained with oxygen introduced in an amount of about 1 to about 3% relative to the amount of the sputtering gas (inert gas) such as argon gas.

Figure 3:
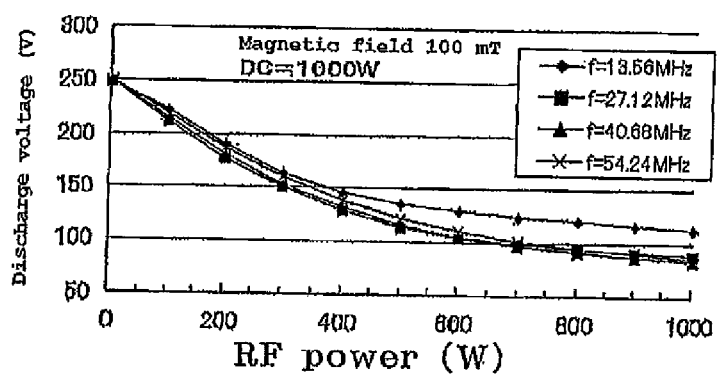
FIG. 3 is a graph showing frequency-dependent changes in discharge voltage in the high magnetic field RF superimposed DC sputtering deposition according to the invention.

An indium-tin complex oxide (ITO) target with a tin oxide content of 10% by weight was placed in the high magnetic field RF superimposed DC sputtering system of FIG. 2, in which an ITO coating was formed on a 125-μm-thick PET film. The temperature of the film substrate was 120° C., the oxygen content was 0.25% based on the amount of argon gas, and the deposition pressure was 0.3 Pa. FIG. 3 shows the results of discharge voltage measurement with different RF powers and different RF power source frequencies at a certain DC power (1,000 W). The horizontal magnetic field at the target surface was 100 mT. For all RF power source frequencies, the discharge voltage decreases with increasing RF power, although the discharge voltage asymptotically approaches a constant value as the ratio of the RF power to the DC power approaches 1. A difference can be seen between the discharge voltage decline curves obtained when the RF power source frequency is 13.56 MHz and when the RF power source frequency is 27.12 MHz, 40.68 MHz, or 54.24 MHz. The discharge voltage is lower when the RF power source frequency is 2, 3, or 4 times 13.56 MHz than when it is 13.56 MHz. This may be because higher frequencies have a higher ability to generate plasma.

Figure 4:
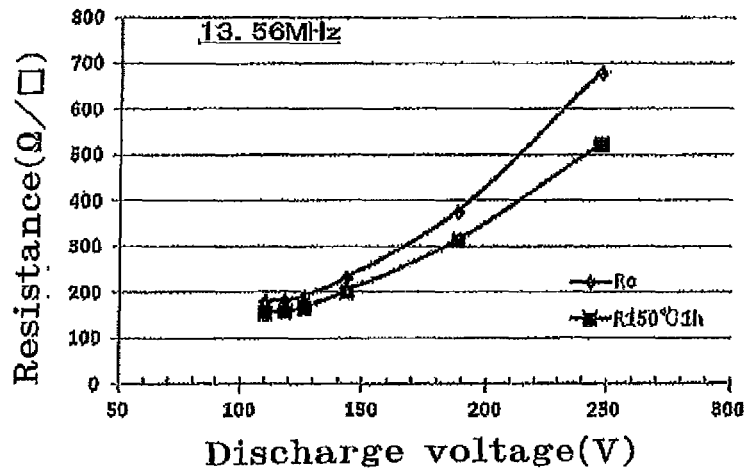
FIG. 4 is a graph showing the relationship between the discharge voltage and the resistance in a case where conventional high magnetic field RF superimposed DC sputtering deposition is reexamined.

Under the same conditions as those shown above (the RF frequency used was 13.56 MHz), a 130-nm-thick ITO coating was formed on a 125-μm-thick PET film by high magnetic field RF superimposed DC sputtering deposition at different discharge voltages. The resulting ITO coatings were measured for initial surface resistances ($R_0$). Subsequently, the ITO coatings were annealed at 150° C. for 1 hour and then measured for surface resistances ($R_{150° C. 1h}$). FIG. 4 shows the results. It is apparent from FIG. 4 that the initial surface resistance ($R_0$) decreased as decreasing discharge voltage and that the surface resistance ($R_{150° C. 1h}$) was slightly reduced after the annealing. However, the minimum surface resistance and specific resistance of the resulting ITO coating were 35 Ω/square and $4.6 \times 10^{-4}$ Ω·cm, respectively. Therefore, the same properties as those of an ITO coating formed on a glass substrate (target values such as a low surface resistance of 10 Ω/square or less and a specific resistance of $1.3 \times 10^{-4}$ Ω·cm) were not obtained.

Figure 5:
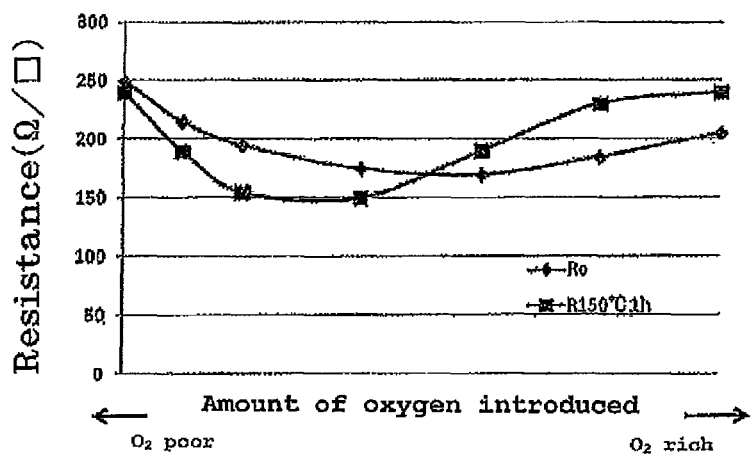
FIG. 5 is a graph showing the relationship between the optimal oxygen supply and the resistance in a case where conventional high magnetic field RF superimposed DC sputtering deposition is reexamined.

Under the same conditions as those shown above (the RF frequency used was 13.56 MHz), a 130-nm-thick ITO coating was also formed on a 125-μm-thick PET film by high magnetic field RF superimposed DC sputtering deposition at a discharge voltage of 110 V (a ratio of RF power to DC power of 1.0) with different contents of introduced oxygen gas during ITO deposition. The resulting ITO coatings were measured for initial surface resistances ($R_0$). Subsequently, the ITO coatings were annealed at 150° C. for 1 hour and then measured for surface resistances ($R_{150° C. 1h}$). FIG. 5 shows the results of examining whether a low surface resistance can be obtained by changing the amount of oxygen relative to the amount of argon gas. The initial surface resistance ($R_0$) and the surface resistance ($R_{150° C. 1h}$) after the annealing were further reduced by optimizing the amount of introduced oxygen gas, but the minimum surface resistance and specific resistance of the resulting ITO coating were 20 Ω/square and about $2.6 \times 10^{-4}$ Ω·cm, respectively.

As shown in FIGS. 4 and 5, when an organic polymer film substrate is used, the temperature conditions for the deposition of an ITO coating must be lower than those for the case where a glass substrate is used. Therefore, even when general high magnetic field RF superimposed DC sputtering deposition is used, it is not possible to form an ITO coating with the same properties as those of an ITO coating formed on a glass substrate (a low resistance of 10 Ω/square or less and a specific resistance of $1.3 \times 10^{-4}$ Ω·cm).

FIG. 6 shows the relationship between the deposition time index and the surface resistance index of an ITO coating, which was obtained in-line using an R-to-R system in a case where the pre-sputtering step (a) was performed and then the forming step (A) was performed. The pre-sputtering step (a) included pre-evacuating the sputtering system to $1.5 \times 10^{-4}$ Pa or less and performing pre-sputtering at a ratio of RF power to DC power of 0.6 using only sputtering gas such as argon gas (without introducing oxygen). The forming step (A) was performed by high magnetic field RF superimposed DC sputtering deposition under the same conditions as those for the measurement shown in FIG. 3 (the RF frequency used was 13.56 MHz). It will be understood that any RF/DC power ratio in the range for the main deposition process may be used.

As shown in FIG. 6, the coating in the phase ▲1▼ or ▲2▼ has a relatively low resistance but varies in resistance every moment with impurity contamination fluctuating significantly because at the early stage of the discharge deposition process, water and gases are generated from the target surface, the wall in the chamber, the organic polymer film substrate, and the like. The coating in this phase appears to have high transparency and low resistance but is difficult to crystallize by post-heating so that lower resistance cannot be obtained. As shown in FIGS. 4 and 5, when pre-sputtering is performed by this phase or when pre-sputtering is not performed, the resulting coating cannot have the desired very low resistance.

However, when the pre-sputtering is further continued so that the discharge deposition process proceeds beyond the phase ▲2▼, water and generated gases decrease while the resistance gradually increases, and the phase ▲3▼ is reached in which there is generated no water or gas. When the pre-sputtering is further continued, the stable phase ▲4▼ is obtained. In the stable phase ▲4▼, not only the coating is not contaminated with impurities derived from water and generated gases, but also the resulting coating can have high quality with a smaller amount of introduced oxygen because of the activation of the surface of the indium-based complex oxide target by the RF discharge.

The pre-sputtering (a) was so performed that the phase ▲4▼ (called the stable phase) in FIG. 6 was reached, in which a 130-nm-thick ITO coating was formed on a 125-μm-thick PET film using an indium-tin complex oxide (ITO) target with a tin oxide content of 10% by weight, placed in the high magnetic field RF superimposed DC sputtering system of an R-to-R system (the intensity of the horizontal magnetic field on the target surface was 100 mT). The temperature of the film substrate was 120° C., and the reached degree of vacuum was $5 \times 10^{-5}$ Pa. Only argon gas was introduced, and the deposition pressure was 0.3 Pa.

After the pre-sputtering (a) was so performed that the stable phase ▲4▼ in FIG. 6 was reached, a 130-nm-thick ITO coating was continuously formed using the same target under the same conditions as those in FIG. 5 except that oxygen gas was not introduced. Specifically, the ITO coating was obtained under the main deposition conditions: a 13.56 MHz high-frequency power of 1,000 W, a DC power of 1,000 W, and a ratio of RF power to DC power of 1. The resulting ITO coating had an initial surface resistance ($R_0$) of 11.5 Ω/square and had a surface resistance ($R_{150° C. 1h}$) of 10 Ω/square after annealed at 150° C. for 1 hour. These results show that the pre-sputtering (a) followed by the main deposition step (A) makes it possible to obtain the desired low-resistance coating.

Figure 7:
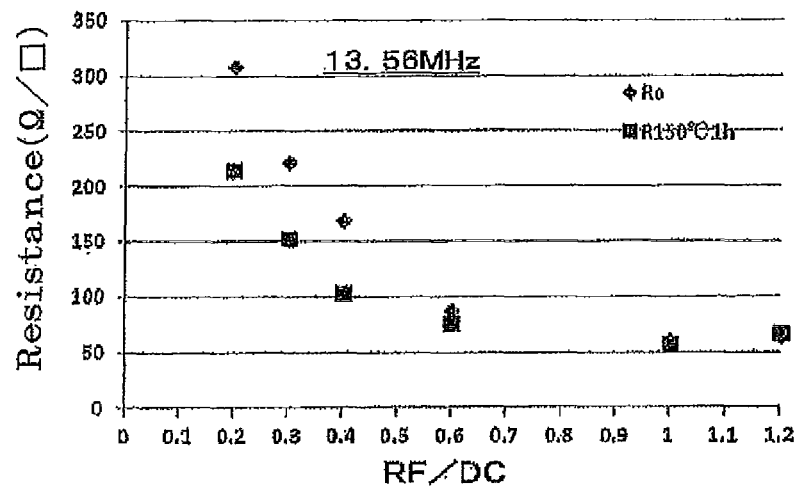
FIG. 7 is a graph showing the effect of the ratio of RF power to DC power in a case where RF power is provided at 13.56 MHz in the high magnetic field RF superimposed DC sputtering deposition according to the invention.

FIGS. 7 to 10 show that the preferred ratio of RF power to DC power varies with the frequency of the RF power source used in the high magnetic field RF superimposed DC sputtering deposition. FIG. 7 shows the behavior in a case where the RF power source frequency is 13.56 MHz. FIG. 7 shows the resistance of an ITO coating obtained by a process including: performing the pre-sputtering step (a) at a roll electrode temperature of 150° C. for deposition and a ratio of RF power to DC power of 0.6 without introducing oxygen until the stable phase is reached; and then performing the forming step (A) by high magnetic field RF superimposed DC sputtering deposition at different ratios of RF power to DC power without introducing oxygen. The temperature of the roll electrode for deposition was set at 150° C., and the thickness of the ITO coating was 130 nm. Other conditions were the same as those in FIG. 6.

FIG. 7 shows that as the ratio of RF power to DC power approaches 1, the resistance of the coating immediately after the deposition decreases, and the degree of oxidation also approaches the level of an appropriate coating. As the ratio exceeds 1, the coating tends to have too high an oxygen content and to increase in resistance. On the other hand, as the power ratio decreases, the coating becomes oxygen-deficient and increases in resistance. It is apparent that when the ratio of RF power to DC power was 1, a surface resistance of 10 Ω/square and a specific resistance of $1.3 \times 10^{-4}$ Ω·cm were obtained after annealing at 150° C. for 1 hour.

Figure 8:
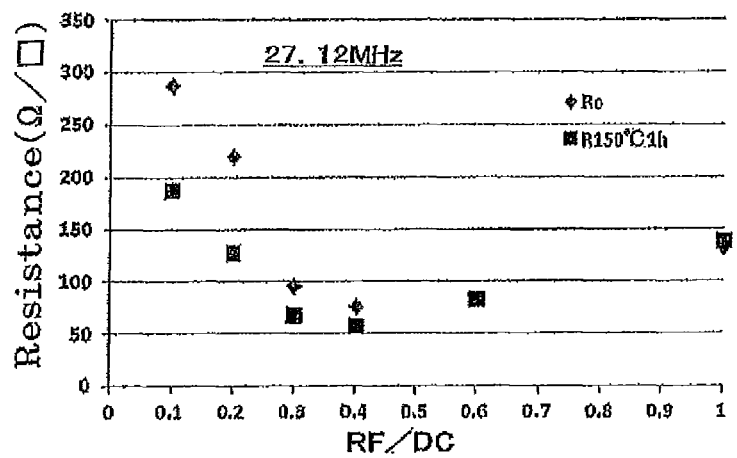
FIG. 8 is a graph showing the effect of the ratio of RF power to DC power in a case where RF power is provided at 27.12 MHz in the high magnetic field RF superimposed DC sputtering deposition according to the invention.
Figure 9:
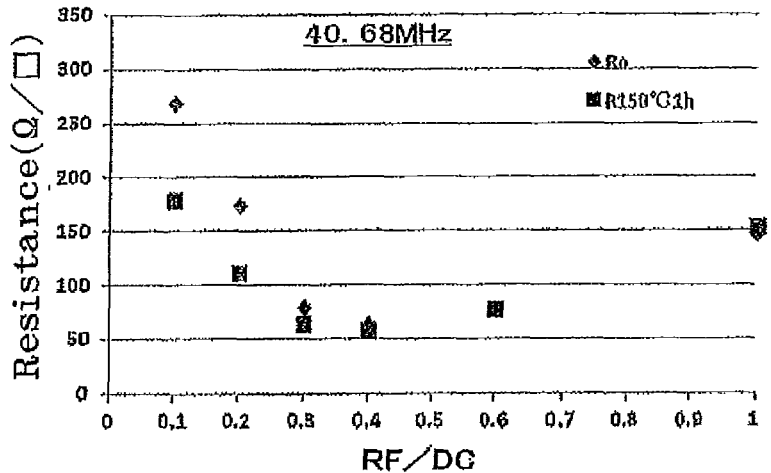
FIG. 9 is a graph showing the effect of the ratio of RF power to DC power in a case where RF is 40.68 MHz in the high magnetic field RF superimposed DC sputtering deposition according to the invention.
Figure 10:
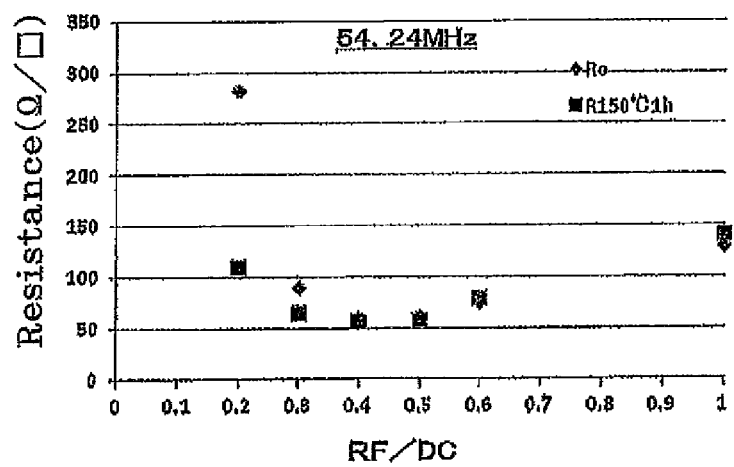
FIG. 10 is a graph showing the effect of the ratio of RF power to DC power in a case where RF is 54.24 MHz in the high magnetic field RF superimposed DC sputtering deposition according to the invention.

FIGS. 8, 9, and 10 show the results obtained when the RF power source frequency was 27.12 MHz, 40.68 MHz, and 54.24 MHz, respectively, in the same process. The other conditions for the results in FIGS. 8, 9, and 10 are the same as those for the results in FIG. 7 except that the ratio of RF power to DC power was 0.3 in the pre-sputtering step (a). When the ratio of RF power to DC power was about 0.35, the surface resistance was the lowest with respect to both the initial surface resistance ($R_0$) of the ITO coating immediately after the deposition and the resistance ($R_{150° C. 1h}$) after annealing at 150° C. for 1 hour. As the ratio of RF power to DC power approaches 1, the coating becomes oxygen-excess. On the other hand, as the ratio approaches 0, the coating becomes oxygen-deficient. FIG. 10 shows that when the RF power source frequency was 54.24 MHz, a 130-nm-thick ITO coating with a surface resistance as low as 9.9 Ω/square was obtained after annealing at 150° C. for 1 hour.

EXAMPLES

Hereinafter, the invention will be described with reference to examples, which however are not intended to limit the invention. Hereinafter, examples of the invention will be described more specifically.

Example 1

(Organic Polymer Film Substrate)

The organic polymer film substrate used was a polyethylene terephthalate (PET) film O300E (125 μm in thickness) manufactured by Mitsubishi Plastics, Inc.

(Pretreatment)

The PET film was placed in an R-to-R sputtering deposition system so that an ITO thin coating could be deposited on the smooth surface of the PET film opposite to its lubricated surface. While the film was taken up using a roll electrode heated at 120° C., degassing was performed with an evacuation system including a cryogenic coil and a turbo-pump, so that an atmosphere with a degree of vacuum of $3 \times 10^{-5}$ Pa was obtained while the film was fed without deposition. Subsequently, argon gas was introduced into the sputtering deposition system, and the PET surface was pretreated by allowing the PET film to pass through a plasma discharge region with an RF power source (13.56 MHz).

(Formation of Undercoat Layer)

An $Al_2O_3$ thin coating with a thickness of 20 nm was deposited on the plasma-treated surface of the PET film by reactive dual magnetron sputtering from an Al metal target.

(Pre-Sputtering of ITO Target)

Subsequently, while the vacuum was maintained, an ITO oxide target (manufactured by Sumitomo Metal Mining Co., Ltd., 10% by weight in tin oxide content), which was previously set on the electrode of a high magnetic field RF superimposed DC sputtering deposition system, was pre-sputtered under the conditions of a DC power density of 1.1 W/cm² and a ratio of RF power (13.56 MHz) to DC power of 0.6. The horizontal magnetic field at the surface of the target was 100 mT. While the film substrate was taken up at a low rate, the pre-sputtering was performed with the surface resistance and transmittance being measured with an in-line monitor. Other conditions were a film substrate temperature of 150° C. and introduction of argon gas only. The pre-sputtering was performed at a pressure of 0.32 Pa. The pre-sputtering was performed until the resistance monitored in-line reached a stable level.

(Main Sputtering Deposition from ITO Target)

Using the same ITO target as in the pre-sputtering, a 130-nm-thick ITO coating was deposited by performing a main sputtering process under the conditions of a DC power density of 1.1 W/cm² and a ratio of RF power (13.56 MHz) to DC power of 1 in the same high magnetic field RF superimposed DC sputtering deposition system. The horizontal magnetic field at the surface of the target was 100 mT. The temperature of the film substrate was 150° C., and only argon gas was introduced. The main sputtering deposition pressure was 0.32 Pa.

(Annealing)

The ITO-coated PET film was heat-treated at 150° C. for 1 hour in the air to give a transparent conductive film.

Examples 2 to 9 and Comparative Examples 1 to 4

Transparent conductive films were obtained as in Example 1, except that the tin oxide ($SnO_2$) content of the ITO target, the RF power source frequency, the ratio of RF power to DC power, and the amount of introduction of oxygen in the high magnetic field RF superimposed DC sputtering deposition, and the annealing temperature were changed as shown in Table 1.

In Example 6, the ITO coating was deposited under the same conditions as those in Example 1, except that in addition to argon gas introduced during the main deposition process, oxygen gas was also introduced in an amount of 0.5% relative to the amount of argon and that the deposition was performed at a film substrate temperature of 170° C. In Example 6, the annealing step (B) was not performed. In Example 7, the ITO coating was deposited under the same conditions as those in Example 1, except that the ratio of RF power to DC power was 0.6 and that oxygen gas was introduced in an amount of 0.1% relative to the amount of argon.

In Comparative Example 1, common DC magnetron sputtering deposition was performed in a high magnetic field of 100 mT, instead of the high magnetic field RF superimposed DC sputtering deposition.

(Evaluation)

The transparent conductive films obtained in the examples and the comparative examples were evaluated as described below. Table 1 shows the results.

(Measurement of Surface Resistance)

The surface resistance of the ITO coating of each transparent conductive film was measured with Loresta GP (model MCP-T600) manufactured by Mitsubishi Petrochemical Co., Ltd.

(Observation of the Crystalline State of Coating)

Figure 12:
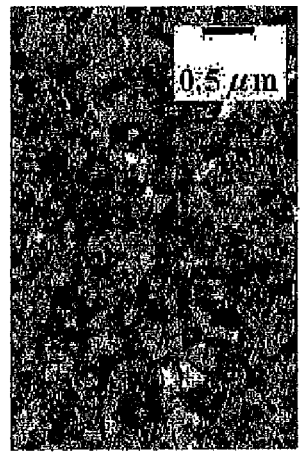
FIG. 12 is a TEM photograph showing crystals in an ITO film obtained in Example 9 according to the invention.

The crystalline state of the ITO coating was checked as follows. Only the ITO coating was sampled from the transparent conductive film by a peeling method and then observed with a transmission electron microscope (TEM) (Hitachi, HF-2000) at an acceleration voltage of 200 kV. FIG. 12 is a TEM photograph showing crystals in the ITO film obtained in Example 9 according to the invention.

(Evaluation of Coating Thickness)

The thickness of the ITO coating was measured as follows. The sample was fixed with resin and then sliced into ultra-thin sections with Hitachi, FB-2100. The sections were observed and measured with the TEM.

(X-Ray Diffraction Measurement)

Figure 11:
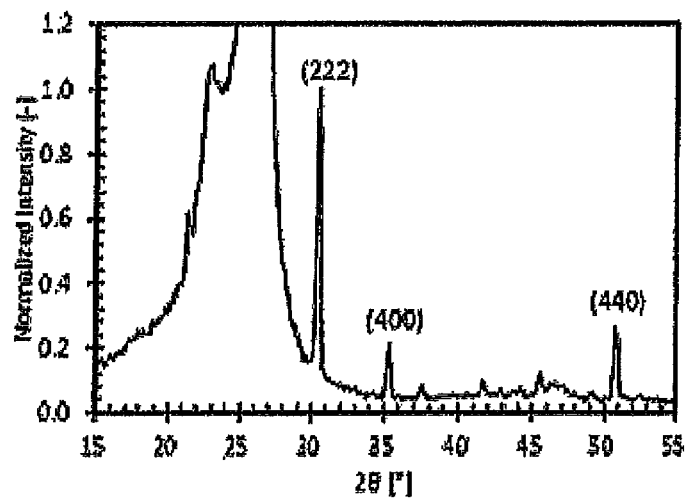
FIG. 11 is an X-ray diffraction chart of an ITO film obtained in Example 1 according to the invention.

X-ray diffraction measurement was performed with the instrument shown below, and the ratio of the (440) plane peak intensity to the (222) plane peak intensity was determined. FIG. 11 is an X-ray diffraction chart of the ITO film obtained in Example 1 according to the invention.
Powder X-Ray Diffractometer RINT-2000 Manufactured by Rigaku Corporation Light source: Cu-Kα radiation (wavelength: 1.541 Å), 40 kV, 40 mA Optical system: collimated beam optical system Divergence slit: 0.05 mm Receiving slit: Soller slit Monochromation and collimation: using a multilayer bevel mirror (Measurement of Internal Stress (Measurement of Compressive Residual Stress))

An X-ray scattering technique was used to determine the residual stress indirectly from crystal lattice strains in the ITO coating.

Using a power X-ray diffractometer manufactured by Rigaku Corporation, the diffraction intensity of the coating was measured at intervals of 0.04° in the measurement scattering angle 2θ range of 59° to 62°. The integral time (exposure time) at each measurement angle was 100 seconds.

The peak (the peak corresponding to the (622) plane of ITO) angle 2θ of the resulting diffraction image and the wavelength λ of the X-ray source were used to calculate the lattice spacing d of the ITO coating. The lattice strain was calculated based on d. Formulae (1) and (2) below were used in the calculations.

[Formulae 1]

$$2d \sin \theta = \lambda \quad (1)$$

$$\epsilon = (d - d_0)/d_0 \quad (2)$$

In the formulae, λ is the wavelength (0.15418 nm) of the X-ray source (Cu Kα radiation), and $d_0$ is the lattice spacing (0.15241 nm) of ITO with no stress. Note that $d_0$ is the value obtained from the ICDD (The International Centre for Diffraction Data) data base.

Figure 13:
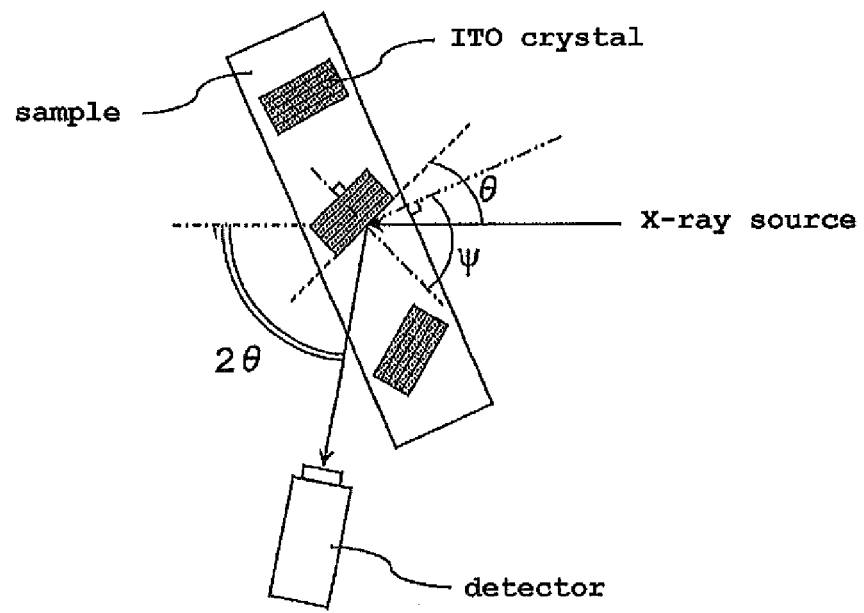
FIG. 13 is a diagram for illustrating angles θ and ψ in X-ray scattering measurement.

As shown in FIG. 13, the X-ray diffraction measurement was performed at the angles ψ is 45°, 50°, 55°, 60°, 65°, 70°, 77°, and 90° between the normal of the film surface and the normal of the ITO crystal plane, respectively. The lattice strain ε was calculated at each angle ψ. The angle ψ between the normal of the film surface and the normal of the ITO crystal plane was controlled by rotating the sample about the TD direction (the direction perpendicular to the MD direction) as the rotation axis center. The relationship between $\sin^2 \psi$ and the lattice strain ε was plotted. Using formula (3) below, the residual stress σ in the in-plane direction of the ITO coating was calculated from the slope of the straight line obtained by the plotting.

[Formulae 2]

$$\varepsilon = \frac{1+\nu}{E}\sigma \sin^2 \Psi - \frac{2\nu}{E}\sigma \quad (3)$$

In the formula, E is the Young's modulus (116 GPa) of ITO, and ν is the Poisson's ratio (0.35). These values are known measured values shown in D. G. Neerinck and T. J. Vink, "Depth profiling of thin ITO films by grazing incidence X-ray diffraction," Thin Solid Films, 278 (1996), pp. 12-17.

TABLE 1

| | ITO coating | | Forming step (A) (RF superimposed DC sputtering deposition) | | | | Evaluations | | | | |
| | | | | | | | $R_0$ after deposition of step (A) | $R_{150° C., 1 h}$ after annealing of step (B) | | | |
| | Thickness (nm) | SnO$_2$ content (wt %) | RF source frequency (MHz) | RF/DC power ratio | Amount (%) of oxygen relative to argon | Annealing step (B) Temperature (° C.) | Surface resistance (Ω/□) | Surface resistance (Ω/□) | Specific resistance (Ω · cm) | Peak intensity ratio ($I_{440}/I_{222}$) | Internal stress (Mpa) |
|---|---|---|---|---|---|---|---|---|---|---|---|
| Example 1 | 130 | 10 | 13.56 | 1 | 0 | 150 | 10.6 | 10 | 1.37 × 10$^{-4}$ | 0.26 | 600 |
| Example 2 | 130 | 10 | 13.56 | 0.6 | 0 | 150 | 15.2 | 13.2 | 1.72 × 10$^{-4}$ | 0.16 | 550 |
| Example 3 | 130 | 10 | 27.12 | 0.35 | 0 | 150 | 13.1 | 10 | 1.30 × 10$^{-4}$ | 0.21 | 500 |
| Example 4 | 130 | 10 | 40.68 | 0.35 | 0 | 150 | 11.2 | 10 | 1.30 × 10$^{-4}$ | 0.22 | 530 |
| Example 5 | 130 | 10 | 54.24 | 0.35 | 0 | 150 | 10.6 | 9.9 | 1.29 × 10$^{-4}$ | 0.24 | 540 |
| Example 6 | 130 | 10 | 13.56 | 1 | 0.5 | None | 11.7 | 12.5 | 1.63 × 10$^{-4}$ | 0.19 | 660 |
| Example 7 | 130 | 10 | 13.56 | 0.6 | 0.1 | 150 | 12.5 | 11.6 | 1.51 × 10$^{-4}$ | 0.21 | 500 |
| Example 8 | 130 | 7.5 | 54.24 | 0.35 | 0 | 150 | 11.8 | 10.5 | 1.37 × 10$^{-4}$ | 0.22 | 530 |
| Example 9 | 130 | 12.7 | 54.24 | 0.35 | 0 | 160 | 10.4 | 9.5 | 1.24 × 10$^{-4}$ | 0.26 | 540 |
| Comparative Example 1 | 130 | 10 | — | DC only | 1.5 | 150 | 103 | 30.5 | 3.97 × 10$^{-4}$ | 0.23 | 1100 |
| Comparative Example 2 | 130 | 10 | 13.56 | 0.2 | 0.5 | 150 | 23.1 | 17.1 | 2.22 × 10$^{-4}$ | 0.19 | 1000 |
| Comparative Example 3 | 130 | 10 | 27.12 | 0.1 | 0.5 | 150 | 29.5 | 22.3 | 2.90 × 10$^{-4}$ | 0.19 | 900 |
| Comparative Example 4 | 130 | 10 | 27.12 | 1 | 0 | 150 | 22.8 | 23.8 | 3.09 × 10$^{-4}$ | 0.17 | 720 |

The ITO coating with a thickness of 130 nm and a tin oxide content of 10% by weight, obtained in each of Examples 1 to 7, had a low specific resistance of $1.2\times10^{-4}$ to $2.0\times10^{-4}$ Ω·cm. In particular, the ITO coating with a thickness of 130 nm and a tin oxide content of 12.7% by weight, obtained in Example 9, had a resistance of 9.5 Ω/square and a lower specific resistance of $1.24\times10^{-4}$ Ω·cm. The ITO coating obtained immediately after the deposition in each of Examples 1 to 5, and Examples 7 to 9 was an amorphous coating containing scattered crystalline parts and therefore vulnerable to an acid etching step. The TEM measurement showed that the ITO coating obtained after the annealing was completely crystallized. In Example 6, the ITO coating was already completely crystallized immediately after the deposition.

The X-ray diffraction analysis also showed that the ITO coating obtained in each of Examples 1 to 9 had a peak intensity ratio ($I_{440}/I_{222}$) of less than 0.3. Since the resulting ITO coating was completely crystallized, the results on the reliability against 100° C. heat and the reliability against 85° C. heat and 85% humidity, necessary for applications such as touch panels, were also good. Each transparent conductive film (including the PET film substrate) had a transmittance of about 90% as measured in the air (at a wavelength of 550 nm). The transmittance is preferably 80% or more, more preferably 85% or more. Although having a thickness of 130 nm, the resulting ITO coating had a residual internal stress of 700 MPa or less, which suggests that the low-damage performance of the high magnetic field RF superimposed DC sputtering deposition was sufficiently provided.

No oxygen needs to be introduced at almost every RF/DC power ratio. However, a very small amount of oxygen gas may be introduced under conditions around the upper or lower limit of the optimal RF/DC power ratio range at each RF frequency. In Example 6 where the RF/DC power ratio was 1 at 13.56 MHz, the deposition was performed while a very small amount of oxygen was introduced in such away that the amount of oxygen was 0.5% relative to the amount of argon. Under such conditions, a substantial amount of oxygen is incorporated into the coating, so that a crystallized ITO coating is obtained immediately after the deposition. In this case, the annealing step is unnecessary, and if the coating is heated at 150° C. for 1 hour, a phenomenon is observed in which polycrystallization proceeds to reduce mobility so that the resistance slightly increases.

In Example 7 where the RF/DC power ratio was 0.6 at 13.56 MHz, the deposition was performed while a very small amount of oxygen was introduced in such a way that the amount of oxygen was 0.1% relative to the amount of argon. Under conditions where the ratio of RF power to DC power is close to 0, an oxygen-deficient coating is formed, which tends to require a longer annealing time for the improvement of the transmittance and the reduction of the surface resistance. In such a case, therefore, oxygen should be introduced in an amount of 0.5% or less relative to the amount of argon so that the transmittance can be improved and the annealing time can be reduced. However, if oxygen is introduced in an amount more than that amount, the specific resistance will not significantly decrease so that it will be impossible to obtain the desired specific resistance.

On the other hand, Comparative Example 1 shows the results of high magnetic field common magnetron sputtering deposition. A magnetic field as high as 100 mT effectively reduces the discharge voltage to 250 V. At a magnetic field of 30 mT, damage to the deposited coating is reduced according to the reduction of the discharge voltage to about 450 V. Therefore, a specific resistance of $3.97\times10^{-4}$ Ω·cm is obtained.

Comparative Examples 2 to 4 show the properties of ITO coatings obtained by performing high magnetic field RF superimposed DC sputtering deposition under conditions out of the RF/DC power ratio range according to the invention at each frequency. According to the results, when the RF/DC power ratio exceeds the upper limit, a coating with too high an oxygen content is formed, which has a high resistance immediately after the deposition and also has a higher surface resistance when subjected to the annealing step. It is suggested that when the RF/DC power ratio is less than the lower limit, the effect of the RF superimposition is low, and the discharge voltage is high, so that damage to the deposited coating is less effectively reduced and the specific resistance is not sufficiently reduced.

DESCRIPTION OF REFERENCE SIGNS

In the drawings, reference sign 1 represents an organic polymer film substrate, 1A a substrate holder or a can roll, 2 a transparent conductive coating, 2A an indium-based complex oxide target, 3 a sputtering electrode, 4 a high magnetic field-generating magnet, 5 a matching box for high frequency introduction, 6 a low-pass filter, 7 a high frequency power source (RF power source), and 8 a direct current power source (DC power source).

The invention claimed is:

1. A transparent conductive film, comprising: an organic polymer film substrate; and a transparent conductive coating provided on at least one surface of the organic polymer film substrate, wherein
    the transparent conductive coating is a crystalline coating of an indium-based complex oxide having a content of a tetravalent metal element oxide of 7 to 15% by weight as calculated by the formula {(the amount of the tetravalent metal element oxide)/(the amount of the tetravalent metal element oxide+the amount of indium oxide)}×100 (%),
    the transparent conductive coating has a thickness in the range of more than 40 to 200 nm,
    the transparent conductive coating has a specific resistance of $1.2\times10^{-4}$ to $2.0\times10^{-4}$ Ω·cm,
    the transparent conductive coating has main X-ray diffraction peaks corresponding to (222) and (440) planes and also has a ratio ($I_{440}/I_{222}$) of (440) peak intensity ($I_{440}$) to ($I_{222}$) peak intensity ($I_{222}$) of less than 0.3, and
    the transparent conductive coating has an internal stress of 700 MPa or less as determined by an X-ray stress measurement method.

2. The transparent conductive film according to claim 1, further comprising an undercoat layer provided on the film substrate, wherein the transparent conductive coating is provided on the film substrate with the undercoat layer interposed there between.

3. The transparent conductive film according to claim 1 wherein the indium-based complex oxide is an indium-tin complex oxide, and the tetravalent metal element oxide is tin oxide.

4. A method for producing the transparent conductive film according to claim 1, comprising:
    the step (A) of forming a transparent conductive coating on at least one surface of an organic polymer film substrate in the presence of inert gas by RF superimposed DC sputtering deposition using an indium-based complex oxide target with a high horizontal magnetic field of 85 to 200 mT at a surface of the target, wherein the indium-based complex oxide target has a content of a tetravalent metal element oxide of 7 to 15 % by weight as calculated by the formula {(the amount of the tetravalent metal element oxide)/(the amount of the tetravalent metal element oxide+the amount of indium oxide)}×100 (%).

5. The method for producing the transparent conductive film according to claim 4, wherein in the forming step (A), the high magnetic field RF superimposed DC sputtering deposition is performed with a ratio of RF power to DC power of 0.4 to 1.2 when an RF power source has a frequency of 10 to 20 MHz.

6. The method for producing the transparent conductive film according to claim 4, wherein in the forming step (A), the high magnetic field RF superimposed DC sputtering deposition is performed with a ratio of RF power to DC power of 0.2 to 0.6 when an RF power source has a frequency of more than 20 MHz to 60 MHz.

7. The method for producing the transparent conductive film according to claim 4, wherein in the high magnetic field RF superimposed DC sputtering deposition for the forming step (A), the organic polymer film substrate has a temperature of 80 to 180° C.

8. The method for producing the transparent conductive film according to claim 4, wherein in the forming step (A), the high magnetic field RF superimposed DC sputtering deposition is performed without introducing oxygen.

9. The method for producing the transparent conductive film according to claim 4, wherein in the forming step (A), the high magnetic field RF superimposed DC sputtering deposition is performed while oxygen is introduced in such a way that the amount of oxygen is 0.5% or less relative to the amount of the inert gas.

10. The method for producing the transparent conductive film according to claim 4, further comprising a pre-sputtering step (a) that is performed before the high magnetic field RF superimposed DC sputtering deposition and comprises forming a coating in the presence of inert gas without introduction of oxygen by RF superimposed DC sputtering deposition with a ratio of RF power to DC power of 0.4 to 1.2 at an RF power source frequency of 10 to 20 MHz until a resulting resistance reaches a stable level.

11. The method for producing the transparent conductive film according to claim 4, further comprising a pre-sputtering step (a) that is performed before the high magnetic field RF superimposed DC sputtering deposition and comprises forming a coating in the presence of inert gas without introduction of oxygen by RF superimposed DC sputtering deposition with a ratio of RF power to DC power of 0.2 to 0.6 at an RF power source frequency of more than 20 MHz to 60 MHz until a resulting resistance reaches a stable level.

12. The method for producing the transparent conductive film according to claim 4, further comprising an annealing step (B) that is performed after the forming step (A).

13. The method for producing the transparent conductive film according to claim 12, wherein the annealing step (B) is performed at a temperature of 120 to 180° C. for 5 minutes to 5 hours in the air.

* * * * *